United States Patent [19]

Yamaguchi et al.

[11] Patent Number: 5,424,225
[45] Date of Patent: Jun. 13, 1995

[54] METHOD OF MANUFACTURING A THIN FILM SOI MOSFET

[75] Inventors: Yasuo Yamaguchi; Tadashi Nishimura, both of Hyogo, Japan

[73] Assignee: Mitsubishi Denki Kabushiki Kaisha, Tokyo, Japan

[21] Appl. No.: 269,287

[22] Filed: Jun. 30, 1994

Related U.S. Application Data

[60] Division of Ser. No. 58,814, May 10, 1993, Pat. No. 5,343,051, which is a continuation of Ser. No. 753,285, Aug. 30, 1991, abandoned, which is a continuation of Ser. No. 439,680, Nov. 22, 1989, Pat. No. 5,125,007.

[30] Foreign Application Priority Data

Nov. 25, 1988 [DE] Germany ............. 63-299136

[51] Int. Cl.$^6$ ............. H01L 21/265; H01L 21/266; H01L 21/84
[52] U.S. Cl. ............. 437/21; 437/41; 437/101; 437/44; 437/909; 437/986
[58] Field of Search ............. 437/21, 41, 101, 909, 437/986, 44

[56] References Cited

U.S. PATENT DOCUMENTS

| | | |
|---|---|---|
| 4,053,916 | 9/1977 | Cricchi et al. . |
| 4,054,895 | 10/1977 | Ham . |
| 4,106,045 | 8/1978 | Nishi . |
| 4,753,896 | 6/1988 | Matloubian ............. 437/29 |
| 4,969,023 | 11/1990 | Svedberg . |
| 4,999,691 | 3/1991 | Hsu et al. . |
| 5,045,487 | 9/1991 | Kodama et al. . |
| 5,075,746 | 12/1991 | Hayashi et al. . |
| 5,125,007 | 6/1992 | Yamaguchi et al. . |

FOREIGN PATENT DOCUMENTS

| | | |
|---|---|---|
| 0304811A1 | 1/1989 | European Pat. Off. . |
| 2637479 | 3/1977 | Germany . |
| 51-147186 | 12/1976 | Japan . |
| 58-98969A | 6/1983 | Japan . |
| 1561903 | 3/1980 | United Kingdom . |

OTHER PUBLICATIONS

Jean-Pierre Colinge, "Reduction of Kink Effect in Thin Film SOI MOSFET's", *IEEE Electron Device Letters*, vol. 9, No. 2, Feb. 1988, pp. 97-99.

Primary Examiner—Olik Chaudhuri
Assistant Examiner—Richard A. Booth
Attorney, Agent, or Firm—Lowe, Price, LeBlanc & Becker

[57] ABSTRACT

An MOS field effect transistor comprises a channel region (6) of a first conductivity type formed in a semiconductor layer (3) on an insulator substrate (2), a source region (8) and a drain region (9) of a second conductivity type formed in contact with one and the other sides of the channel region (6) in the semiconductor layer (3), respectively, a body region (7) formed in contact with at least a part of the channel region (6) and a part of a periphery of the source region (8) in the semiconductor layer (3) and having a higher impurity concentration than that of the channel region (6), a gate dielectric thin film (4) and a gate electrode (5) formed on the channel region (6), and a conductor (14a) connected in common to the source region (8) and the body region (7).

9 Claims, 18 Drawing Sheets

METHOD OF MANUFACTURING A THIN FILM SOI MOSFET

This application is a division of U.S. application Ser. No. 08/058,814 filed May 10, 1993, now U.S. Pat. No. 5,343,051, which is a continuation of U.S. application Ser. No. 07/753,285, filed Aug. 30, 1991 now abandoned, which is a continuation of U.S. application Ser. No. 07/439,680, filed Nov. 22, 1989, now U.S. Pat. No. 5,125,007.

BACKGROUND OF THE INVENTION

1. Field of the Invention

The present invention relates generally to MOS (Metal-Oxide-Semiconductor) field effect transistors (referred to as "SOI-MOSFET" hereinafter) formed in semiconductor layers on insulator substrates, and more particularly, to body regions for improving a withstand voltage between source and drain, and for preventing a kink effect on a curve representing a relation between a drain voltage and a drain current.

2. Description of The Background Art

FIG. 16 is a plan view of a conventional SOI-MOSFET, and FIGS. 17 and 18 are sectional views taken along a line I—I and a line J—J in FIG. 16, respectively. Referring to these drawings, an insulator layer 2 formed on a silicon substrate 1 and a silicon film is formed on the insulator layer 2. A channel region 6 having a low-concentration of p type impurity is formed in the silicon layer 3 surrounded by an isolation oxide film 10, and a source region 8 and a drain region 9 having a high-concentration of n type is formed in contact with one and the other sides of the channel region 6, respectively. In addition, in the silicon layer 3, a body region 27 having a high-concentration of p type impurity is formed in contact with one end of the elongate channel region 6 provided between the source region 8 and the drain region 9.

A gate dielectric thin film 4 is formed on the channel region 6 and a gate electrode 5 is formed on the dielectric thin film 4. The silicon layer 3 and the gate electrode 5 are covered with an interlayer insulating film 11. Contact holes 13a, 13b, 13c and 13d are made in the interlayer insulating film 11, and conductors 15a, 15b, 15c and 15d are connected through the contact holes to the source region 8, the gate electrode 5, the drain region 9 and the body region 27, respectively.

In the SOI-MOSFET structured as the foregoing, when a positive voltage is applied to the gate electrode 5, n type carriers (electrons) are induced in an upper partial layer of the p type channel region 6, thereby inverting the upper partial layer to the same n conductivity type as those of the source region 8 and the drain region 9, allowing a current to flow between the source region 8 and the drain region 9. In addition, since a concentration of the n type carriers induced in the upper partial layer is changed depending on a gate voltage, a current amount flowing through the channel region 6 can be controlled by the gate voltage. This is a principle of an operation of the MOSFET.

When a voltage applied between the source region 8 and the drain region 9 is high, the carriers are accelerated to a high speed in the channel region 6. The carriers accelerated in the channel region 6 generate pairs of electron and hole near the drain region 9 due to impact ionization. Although the generated electrons flow into the n+ type drain region 9, the holes flow into the body region 27 having a higher concentration of p type impurity than that of the channel region 6 to be drawn out through the conductor 15d. More specifically, the body region 27 serves to remove the excessive holes generated by impact-ionization from the channel region 6.

In case no body region 27 is provided, when the silicon layer 3 is thick (for example about 5000 A), there occurs unfavorable kink effect on a curve showing a relation between a drain voltage and a drain current. The kink effect is described in "IEEE Electron Device Letter," Vol. 9, No. 2, pp. 97-99, 1988.

On the other hand, a thin film SOI-MOSFET having a silicon layer 3 so thin (for example, a thickness of 500 A-1500 A) that the whole channel region 6 becomes a depletion layer by an application of the gate voltage has excellent characteristics as compared with an SOI-MOSFET having a thick silicon layer 3. For example, in the thin film SOI-MOSFET, undesirable short channel effect is reduced and a leak current between source and drain is reduced.

However, in case no body region 27 is provided in the thin film SOI-MOSFET, the holes generated by impact ionization are stored in the channel layer 6 which is completely depleted and has a high potential, so that the potential is further increased. Accordingly, an electrical barrier between the source region 8 and the channel region 6 is lowered, inducing a sudden injection of the electrons from the source region 8 into the channel region 6. As a result, the channel current is rapidly increased. More specifically, in general the thin film SOI-MOSFET generally has a considerably low withstand voltage between source and drain as compared with a general SOI-MOSFET.

In case the body region 27 is provided in the thin film SOI-MOSFET, since the excessive holes stored in the channel region 6 can be removed, the withstand voltage between source and drain can be remarkably improved.

In the conventional SOI-MOSFET shown in FIG. 16, however, the body region 27 occupies a considerable amount of a planar area of the silicon layer 3. More specifically, a conventional body region 27 makes it difficult to improve integration of an SOI-MOSFET circuit.

FIG. 19 and FIG. 22 are plan views for explaining a method of manufacturing the SOI-MOSFET of FIG. 16. FIGS. 20 and 21 are sectional views taken along a line K—K and a line L—L in FIG. 19, respectively. FIGS. 23 and 24 are sectional views taken along a line M—M and a line N—N in FIG. 22, respectively.

First, referring to FIG. 19 to FIG. 21, an insulator layer 2 is formed on a silicon substrate 1 and a silicon layer 3 having a low-concentration of p type impurity is formed on the insulator layer 2. The silicon layer 3 in which an SOI-MOSFET is to be formed is isolated as an island through formation of an isolation oxide film 10. Thereafter, a dielectric thin film or a conductor layer is deposited on the silicon layer 3, whereby gate dielectric thin film 4 and a gate electrode 5 are formed by etching using a photoresist pattern 20 as a mask. Furthermore, an area of the semiconductor layer 3 in which a body region 27 is to be formed is masked by a resist layer 29. By selectively implanting ions 30 of arsenic or phosphorus to a higher concentration (for example, $10^{18}$–$10^{20}$ atoms/cm$^3$), using the resist layers 20 and 29 as masks, n+ type source region 8 and drain region 9 are formed.

Now referring to FIG. 22 to FIG. 24, after the removal of the resist layers 20 and 29, the semiconductor layer 3 is covered with a resist layer 31, leaving only the area which will be the body region 27. By selectively implanting boron ions 32 to a higher concentration (for example, $10^{18}$–$10^{20}$ atoms/cm$^3$), using the resist layer 31 as a mask, a p+ type body region 27 is formed.

Thereafter the resist layer 31 is removed and the semiconductor layer 3 is covered with an interlayer insulating film 11. Contact holes 13a, 13b, 13c and 13d are made in the interlayer insulating film 11. By connecting through the contact holes conductors 15a, 15b, 15c and 15d to the source region 8, the gate electrode 5, the drain region 9 and the body region 27, respectively the conventional SOI-MOSFET shown in FIG. 16 to FIG. 18 is completed.

As described in the foregoing, manufacturing a conventional SOI-MOSFET includes a several steps necessary only for forming the body region 27. More specifically, a conventional body region 27 makes a method of manufacturing SOI-MOSFET complicated.

SUMMARY OF THE INVENTION

In accordance with the above described background art, an object of the present invention is to provide an SOI-MOSFET comprising a body region in which a planar area occupied by SOI-MOSFET is not increased.

Another object of the present invention is to provide an SOI-MOSFET comprising a body region which can be formed without making the manufacturing steps complicated.

According to one aspect of the present invention, an MOS field effect transistor comprises a channel region of a first conductivity type formed in a semiconductor layer on an insulator substrate, source and drains regions of a second conductivity type formed in contact with one and the other sides of the channel region respectively in the semiconductor layer, a body region of the first conductivity type having a higher impurity concentration than that of the channel region, and being formed in contact with at least a part of the channel region and at least a part of a periphery of the source region in the semiconductor layer, a gate dielectric thin film and a gate electrode formed on the channel region, a first conductor connected to the source region and the body region in common, a second conductor connected to the gate electrode, and a third conductor connected to the drain region.

According to another aspect of the present invention, a method of manufacturing an MOS field effect transistor comprises steps of covering a silicon layer of a first conductivity type formed on an insulator substrate with a nitride film, covering a part of the nitride layer with a first resist layer, etching the nitride layer using the first resist layer as a mask, thereby leaving the nitride layer on a transistor region of the silicon layer, forming a body region in an outer periphery of the transistor region of the silicon layer by implanting ions of impurities of the first conductivity type using the first resist layer as a mask, forming an isolation oxide film by a thermal oxidation of the silicon layer using the nitride layer as a mask after the removal of the first resist layer and diffusing impurities in the body region toward inside of the transistor region, thereby leaving the body region at least under a bird's beak of the isolation oxide film in a peripheral portion of the transistor region of the silicon layer, forming a gate insulating film and a gate electrode using a second resist layer after the removal of the nitride layer, forming a source region and a drain region by implanting ions of impurities of a second conductivity type using the second resist layer and the isolation oxide film as masks, covering the silicon layer and the gate electrode with an interlayer insulating film after the removal of the second resist layer, forming contact holes exposing not only a part of the source region but also a part of the body region, forming a conductor to be connected to the source region and the body region through the contact holes.

According to a further aspect of the present invention, a method of manufacturing an MOS field effect transistor comprises the steps of covering a semiconductor layer formed on insulator substrate with an oxide layer, covering a part of the oxide layer with a first resist layer, etching the oxide layer using the first resist layer as a mask, thereby leaving the oxide layer on a transistor region of the semiconductor layer, forming a body region in an outer periphery of the transistor region of the semiconductor layer by implanting ions of impurities of a first conductivity type using the first resist layer as a mask, diffusing the impurities in the body region toward inside of the transistor region by heat treatment in an inert atmosphere after the removal of the first resist layer, so that the body region extends under a peripheral portion of the oxide layer, leaving the transistor region of the semiconductor layer as an island by etching using the oxide layer as a mask, forming a gate insulating film and a gate electrode using a second resist layer after the removal of the oxide layer, forming a source region and a drain region by implanting ions of impurities of a second conductivity type using a third resist layer covering the body region in addition to the second resist layer as masks, covering the semiconductor layer and the gate electrode with an interlayer insulating film after the removal of the second and third resist layers, forming contact holes exposing not only a part of the source regions but also a part of the body region, forming a conductor to be connected to the source region and the body region through the contact holes.

Accordingly, in the SOI-MOSFET according to the present invention, since a body region having the same conductivity type as that of a channel region and having a high impurity concentration is formed in contact with at least a part of the channel region and at least part of a periphery of a source region, the body region can be formed, barely increasing an planar area occupied by the SOI-MOSFET and without making manufacturing steps complicated.

DESCRIPTION OF THE PREFERRED EMBODIMENTS

Figure 1:
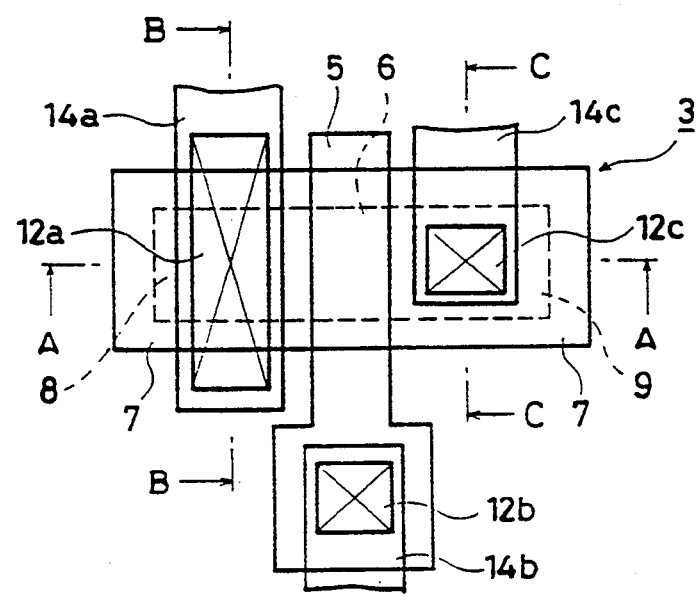
FIG. 1 is a plan view showing an SOI-MOSFET according to one embodiment of the present invention.
Figure 2:
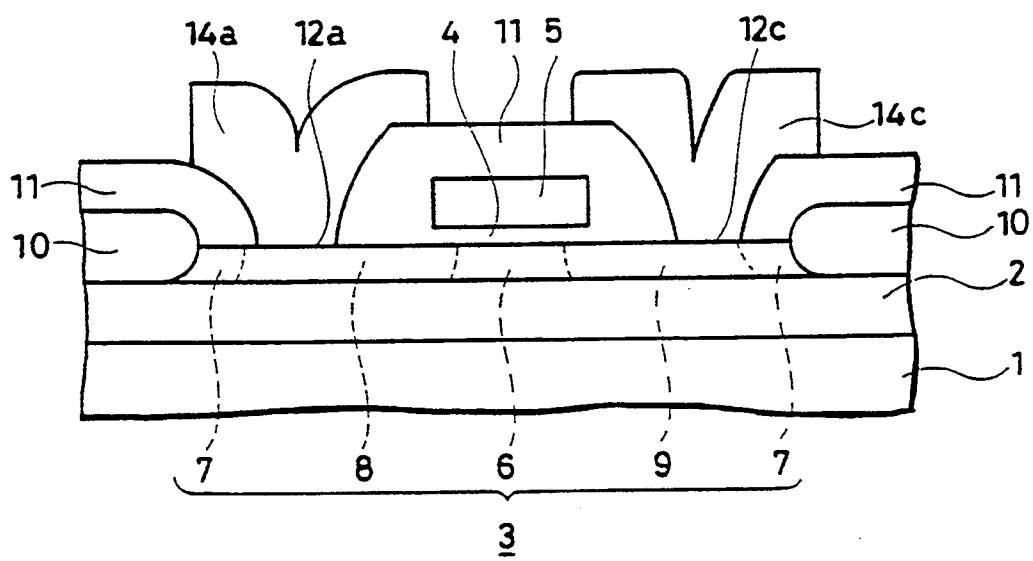
FIG. 2, FIG. 3 and FIG. 4 are sectional views taken along lines A—A, B—B and C—C in FIG. 1, respectively.
Figure 3:
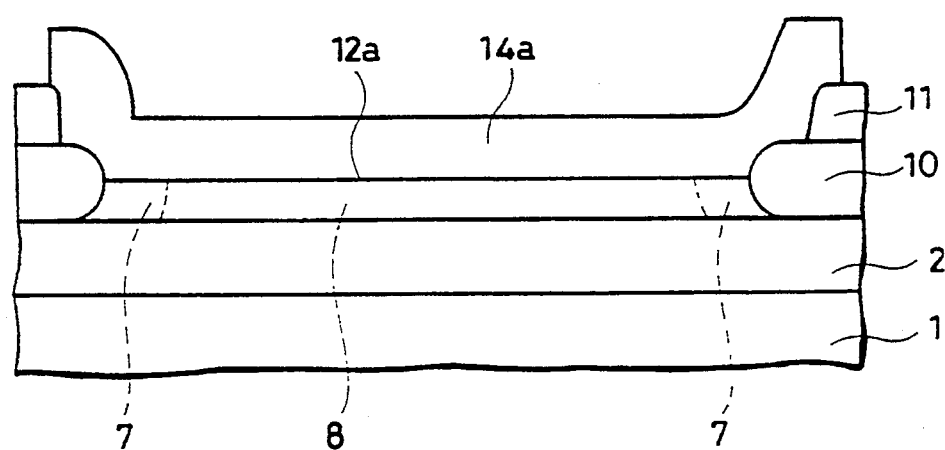
Figure 4:
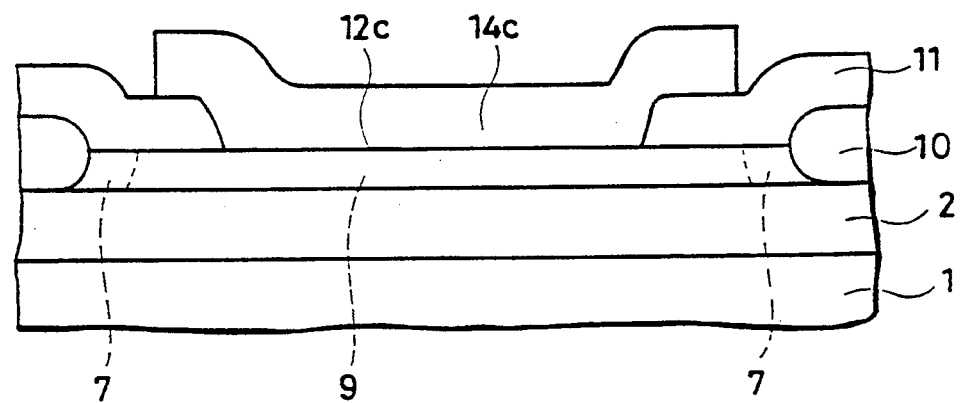

FIG. 1 is a plan view showing an SOI-MOSFET according to one embodiment of the present invention, FIG. 2, FIG. 3 and FIG. 4 are sectional views taken along lines A—A, B—B and C—C in FIG. 1, respectively. Referring to these figures, an insulator layer 2 is formed on a silicon substrate 1. A silicon film 3 is formed on the insulator layer 2. A channel region 6 comprising a low-concentration (for example, $10^{16}$–$10^{17}$ atoms/cm$^3$) of p type impurity (for example boron) is formed in the silicon layer 3 surrounded by an isolation oxide film 10, and a source region 8 and a drain region 9 comprising a high-concentration (for example, $10^{19}$–$10^{21}$ atoms/cm$^3$) of n type impurity (for example, arsenic, phosphorus or antimony) are formed in contact with one and the other sides of the channel region 6, respectively. An elongate body region 7 comprising a high-concentration (for example, $10^{17}$–$10^{19}$ atoms/cm$^3$) of p type impurity is formed in an inner periphery of the silicon layer 3 so as to surround the source region 8, the channel region 6 and the drain region 9.

A thin gate dielectric film 4 is formed on the channel region 6 and a gate electrode 5 is formed on the dielectric thin film 4. The silicon layer 3 and the gate electrode 5 are covered with an interlayer insulating film 11. Contact holes 12a, 12b and 12c are made in the interlayer insulating film 11. A conductor 14a is connected in common to the source region 8 and the body region 7 through the contact hole 12a. Conductors 14b and 14c are connected to the gate electrode 5 and the drain region 9 through the contact holes 12b and 12c, respectively.

Accordingly, in the SOI-MOSFET of FIG. 1, even if excessive holes are generated in the channel region 6 by impact ionization, the excessive holes can be absorbed in the body region 7 having a high-concentration of p type impurity, so that the absorbed excessive holes can be removed through the conductor 12a.

Figure 15:
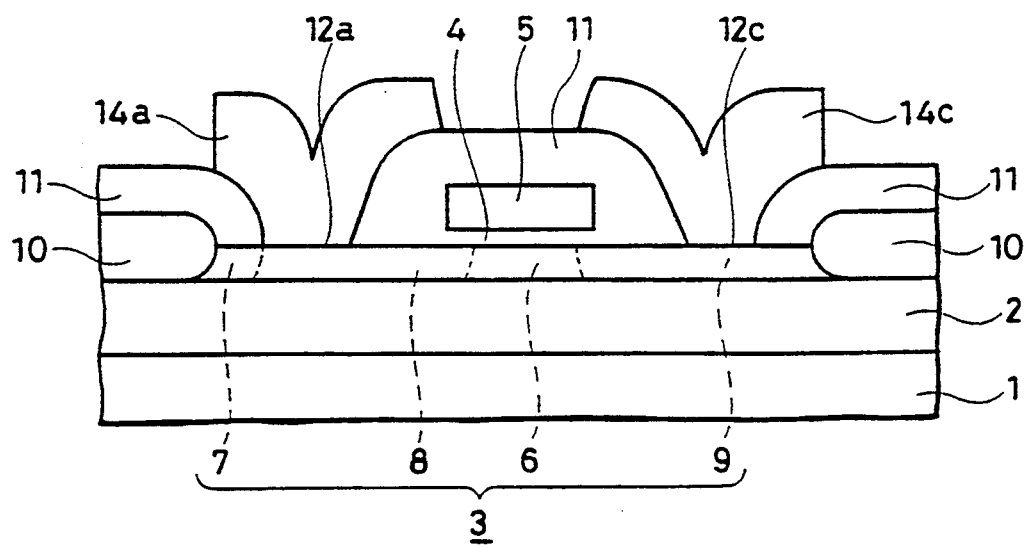
FIG. 15 is a sectional view taken along a line H—H in FIG. 14.
Figure 16:
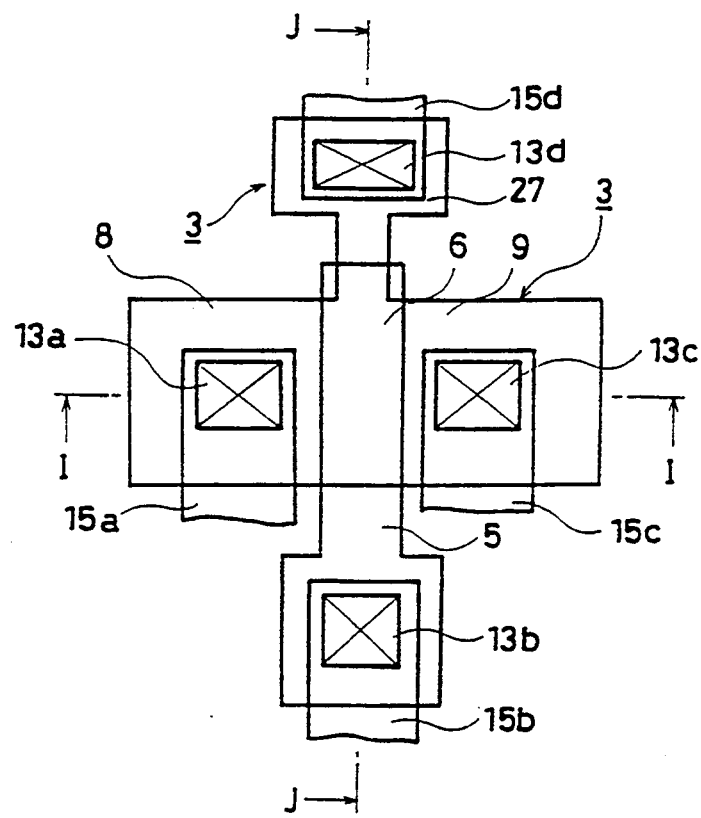
FIG. 16 is a plan view showing a conventional SOI-MOSFET.
Figure 17:
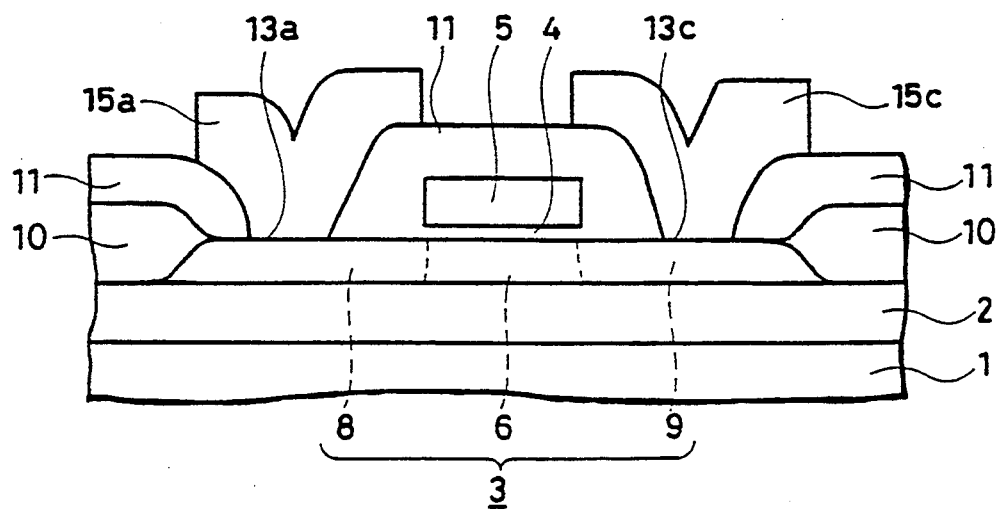
FIG. 17 and FIG. 18 are sectional views taken along a line I—I and a line J—J in FIG. 16, respectively.
Figure 18:
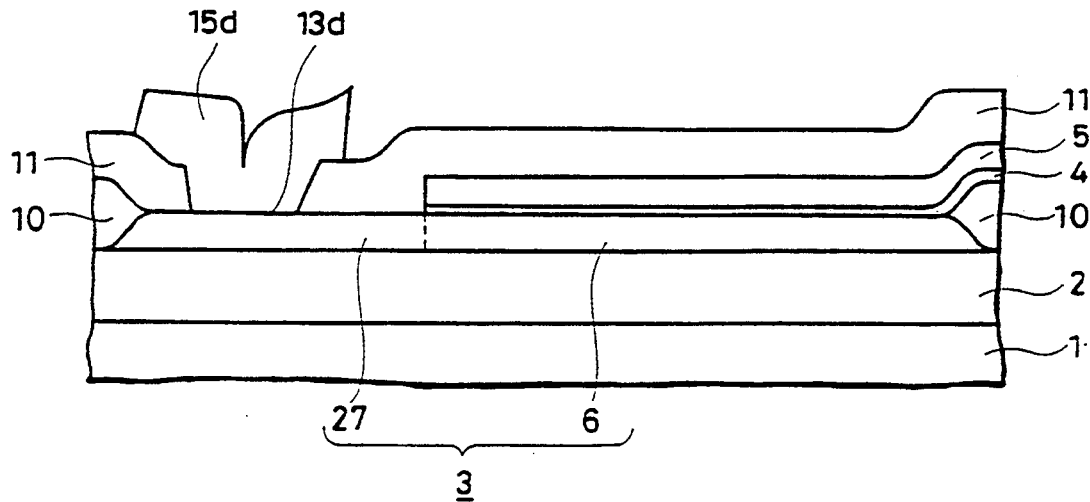
Figure 19:
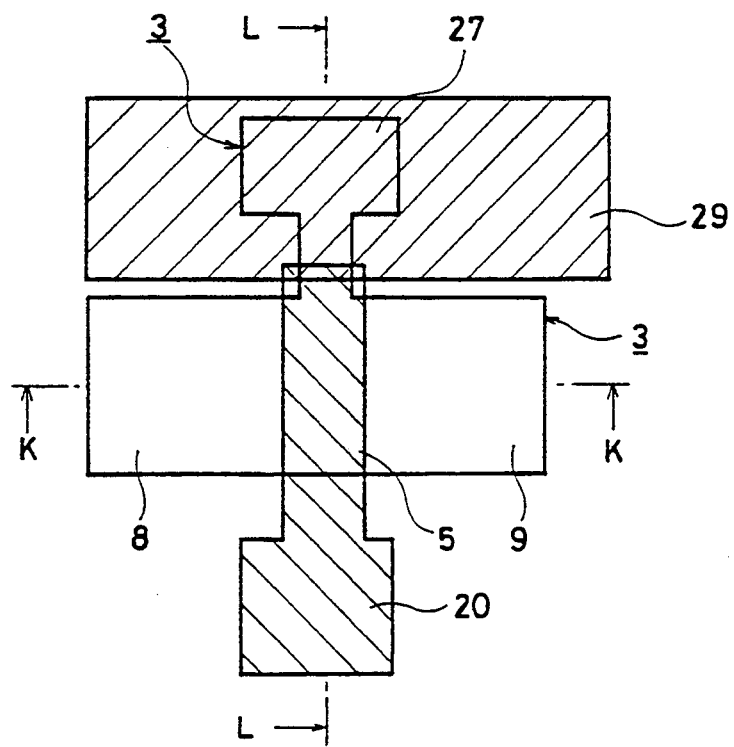
FIG. 19 and FIG. 22 are plan views for explaining a method of manufacturing the conventional SOI-MOSFET shown in FIG. 16.
Figure 20:
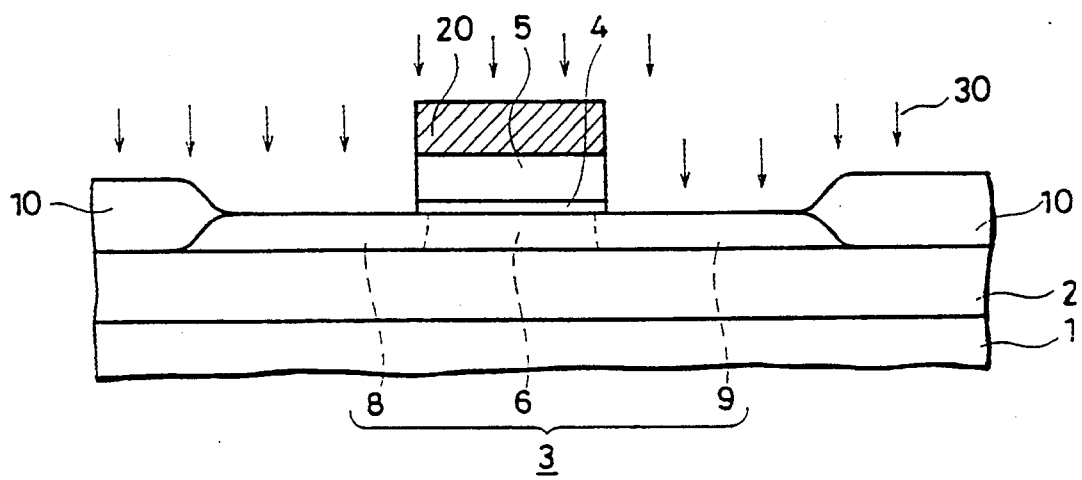
FIG. 20 and FIG. 21 are sectional views taken along lines K—K and L—L in FIG. 19, respectively.
Figure 21:
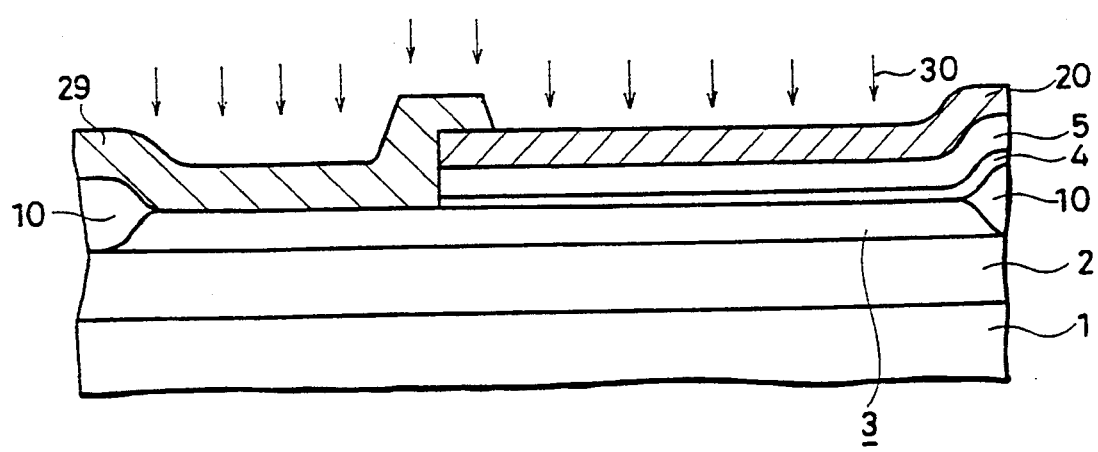
Figure 22:
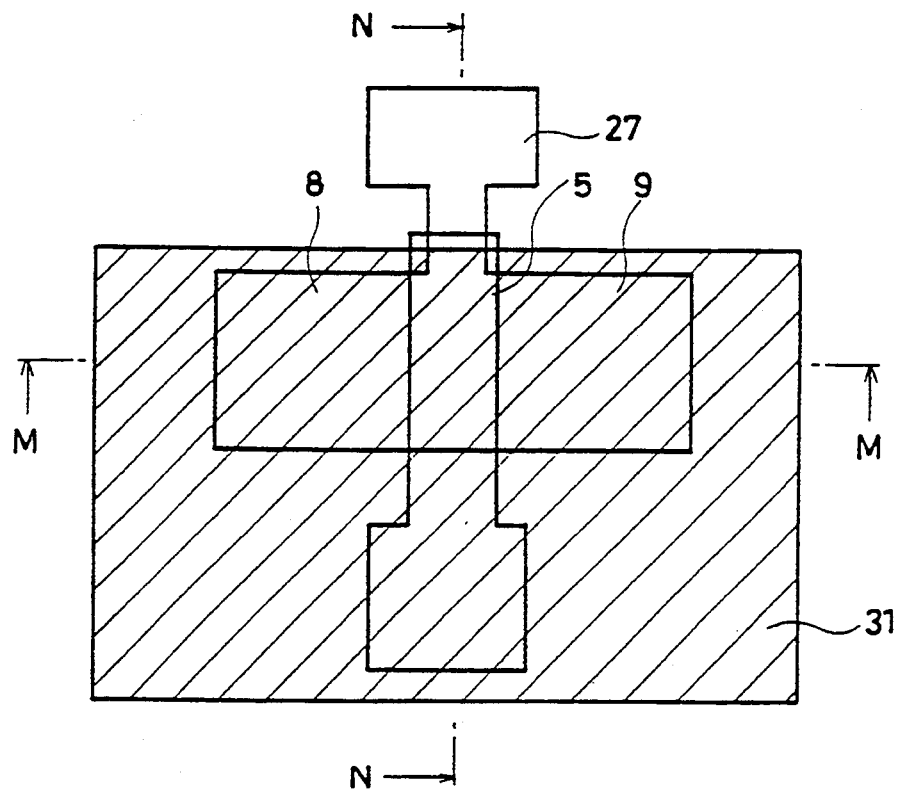
Figure 23:
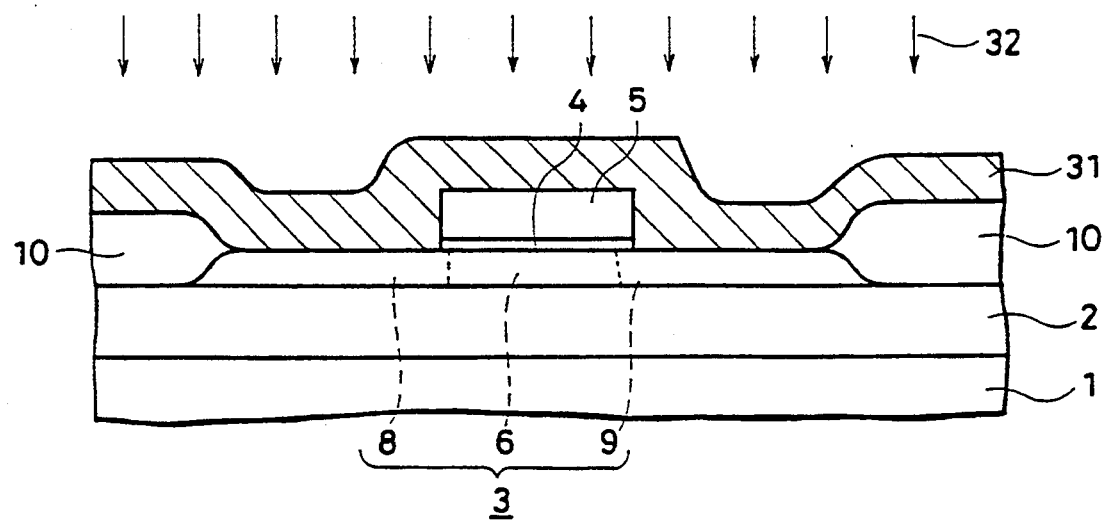
FIG. 23 and FIG. 24 are sectional views taken along lines M—M and N—N in FIG. 22, respectively.
Figure 24:
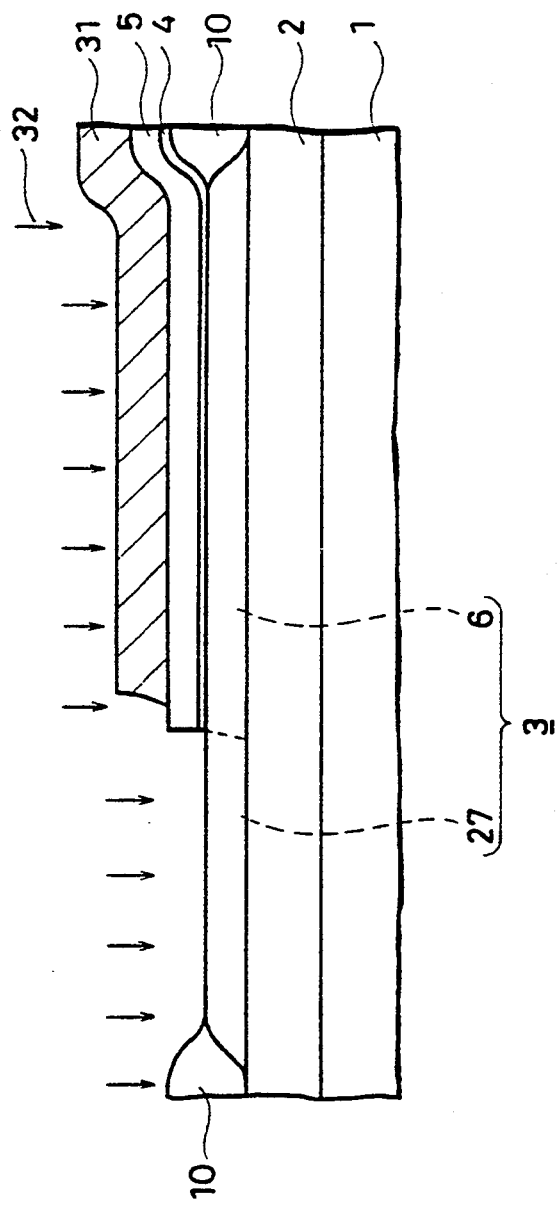

In addition, in the SOI-MOSFET of FIG. 1, since the elongate body region 7 is provided surrounding the source region 8, the channel region 6 and the drain region 9, there is no need to provide an additional area only for the body region 27 in the conventional SOI-MOSFET shown in FIG. 15.

Furthermore, the connecting conductor 14a to the source region 8 also serves as a connecting conductor to the body region 7 through the contact hole 12a. Accordingly, the SOI-MOSFET in FIG. 1 allows improvement of integration of a circuit.

FIG. 5A to FIG. 5F are sectional views for explaining a method of manufacturing such an SOI-MOSFET as shown in FIG. 1.

Figure 5A:
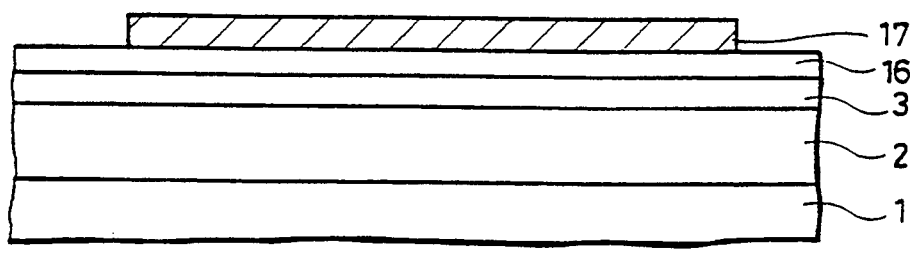
FIG. 5A to FIG. 5F are sectional views for explaining a method of manufacturing such an SOI-MOSFET as shown in FIG. 1.

Referring to FIG. 5A, an insulator layer 2 is formed on a silicon substrate 1 and a silicon film 3 having a low-concentration of p type impurity is formed on the insulator layer 2. A silicon nitride film 16 is deposited on the silicon layer 3, and a resist pattern 17 is formed on the nitride film 16 by photolithography.

Figure 5B:
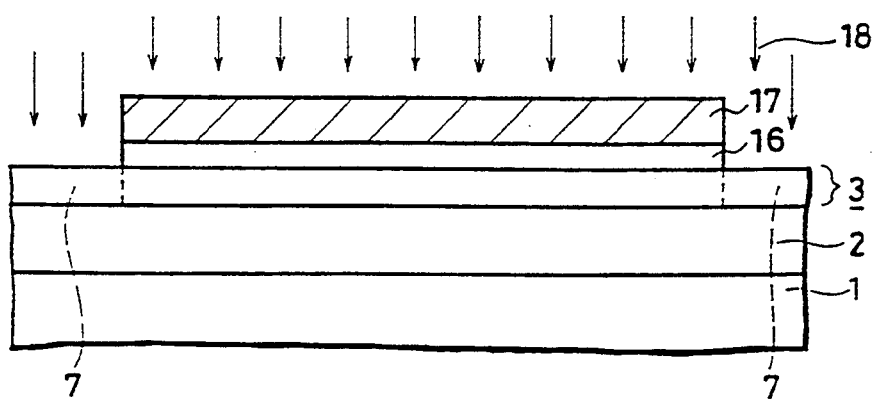

Referring to FIG. 5B, the nitride film 16 is etched using the resist pattern 17 as a mask. Thereafter, ions of p type impurity are implanted in the silicon layer 3 using the resist layer 17 and the nitride film 16 as masks, thereby forming a body region 7 of a high-impurity concentration.

Figure 5C:
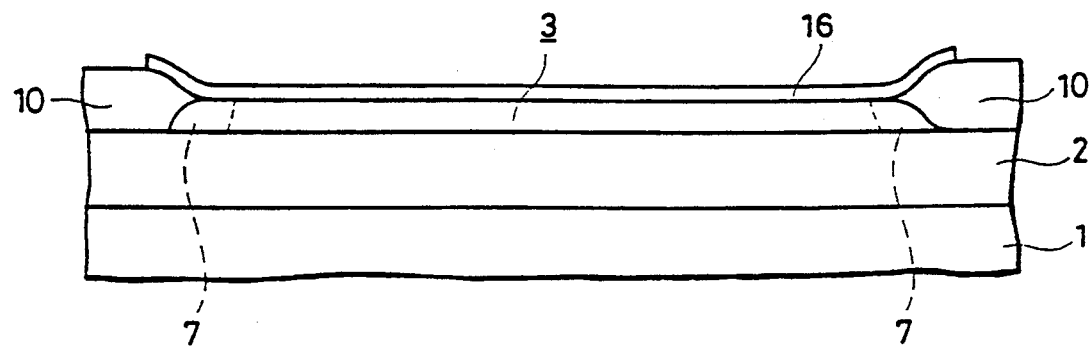

Referring to FIG. 5C, the resist layer 17 is removed. Then, by selectively thermally oxidizing the silicon layer 3 using the silicon nitride film 16 as a mask, an isolation oxide film 10 is formed. At this time, an end portion of the isolation oxide film 10 becomes like a bird's beak. In addition, during the heat treatment, the p type impurity in the body region 7 diffuses in the silicon layer surrounded by the isolation oxide film whereby an elongate body region 7 is disposed along an inner periphery of the isolation oxide film 10.

Figure 5D:
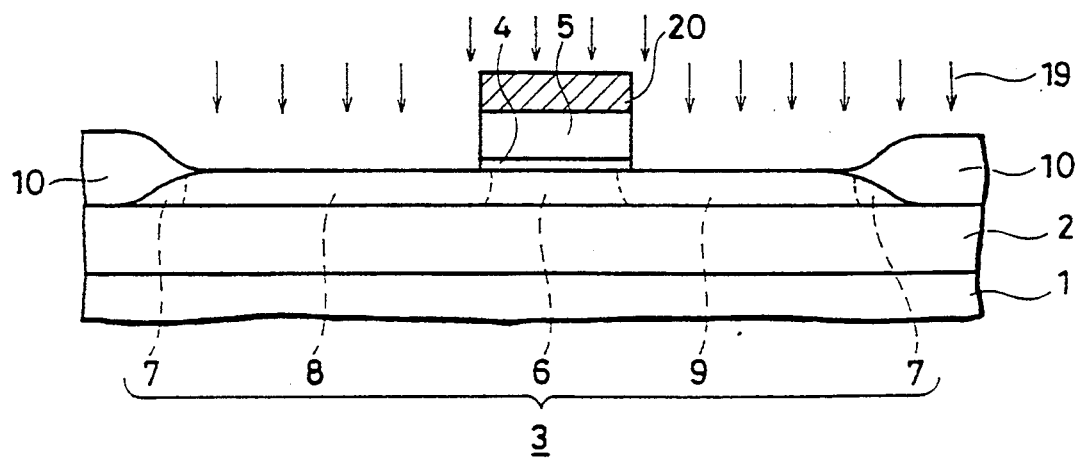

Referring to FIG. 5D, after the removal of the silicon nitride film 16, a gate dielectric thin film 4 and a gate electrode 5 thereon are formed by patterning using a resist layer 20. Then, by selectively implanting n type impurity ions 19 to a higher concentration, using the resist layer 20 and the isolation oxide film 10 as masks, a source region 8 and a drain region 9 are simultaneously formed. At this time, the elongate body region 7 is left under the bird's beak at the end portions of the isolation oxide film 10.

Figure 5E:
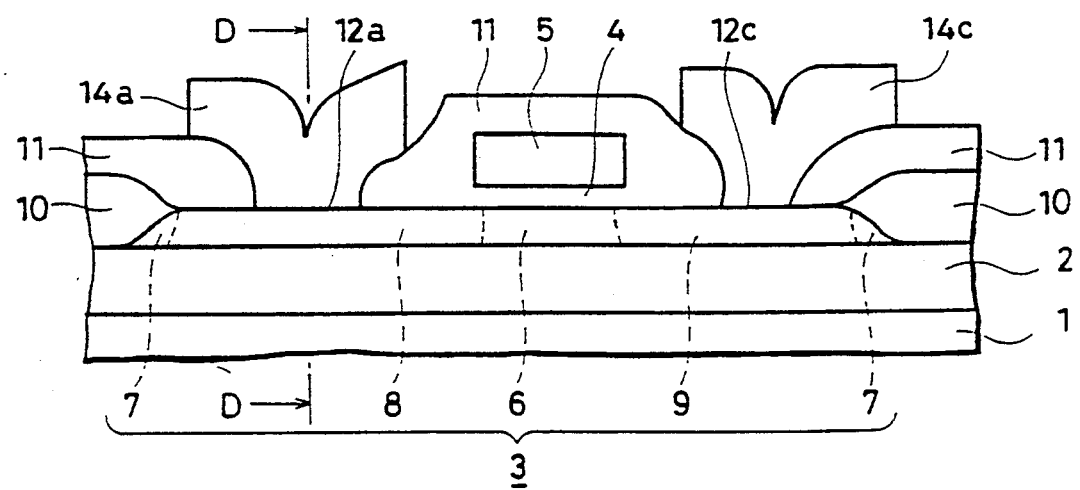

Referring to FIG. 5E, after the removal of the resist layer 20, the silicon layer 3 and the gate electrode 5 are covered with an interlayer insulating film 11. Contact holes 12a, 12c and the like are formed in the interlayer insulating film 11 in which conductors 14a and 14c are formed.

Figure 5F:
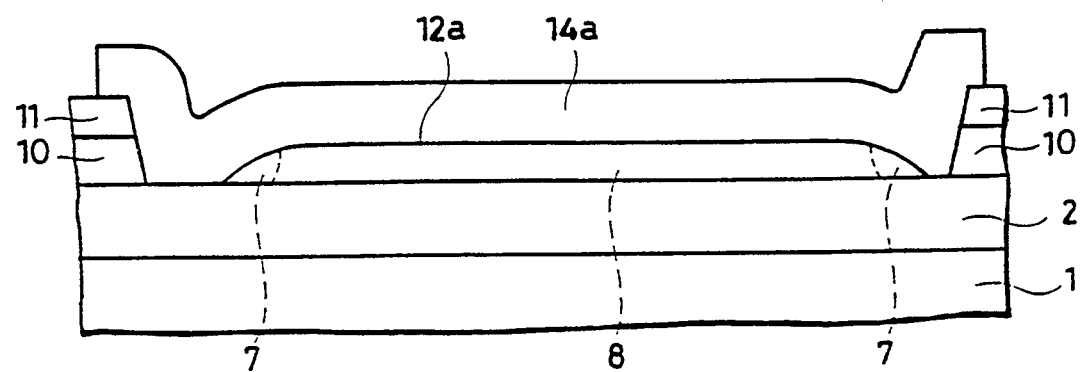

FIG. 5F is a sectional view taken along a line D—D in FIG. 5E. As can be seen from the drawing, the contact hole 12a is formed so as to remove the bird's beak of the isolation oxide film 10, and the conductor 14a is connected not only to the source region 8 but also to the body region 7.

Figure 6A:
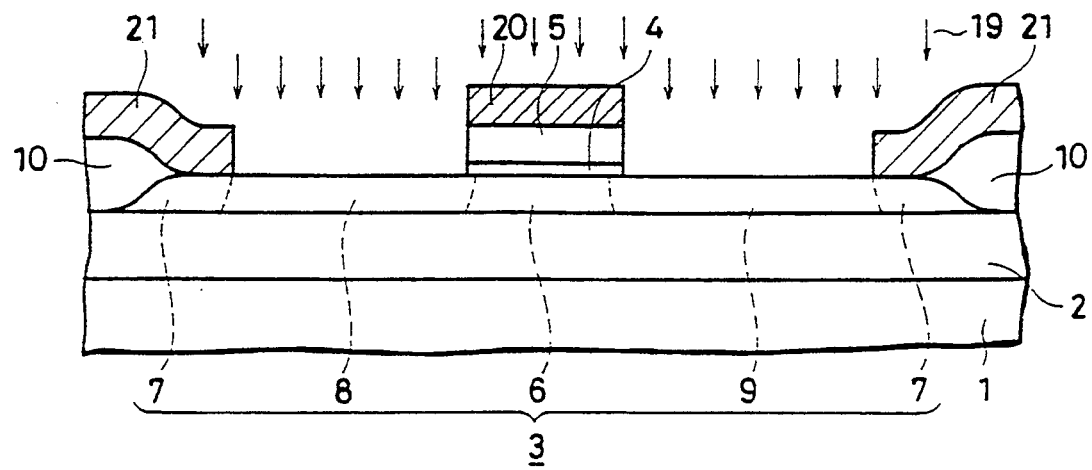
FIG. 6A to FIG. 6C are sectional views for explaining modifications of the manufacturing method shown in FIG. 5A to FIG. 5F.
Figure 6B:
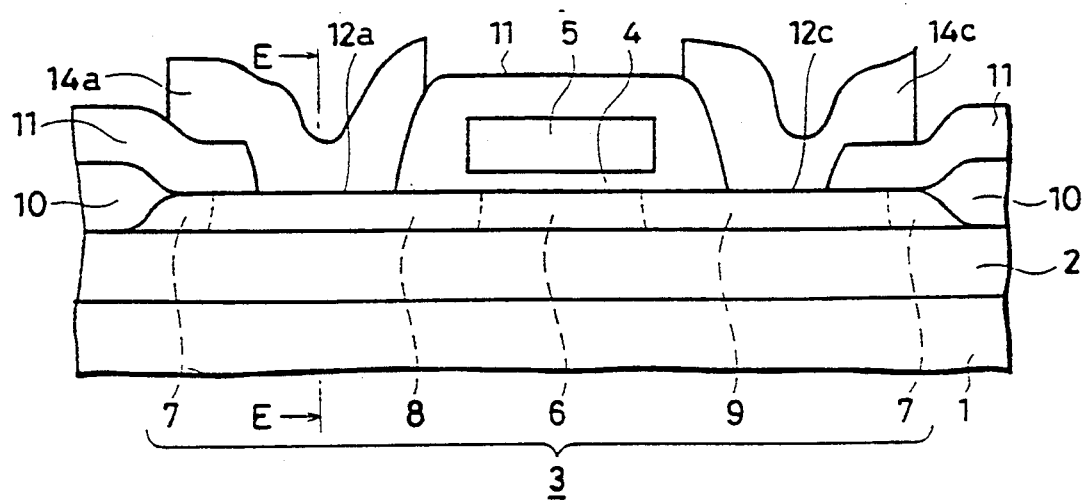
Figure 6C:
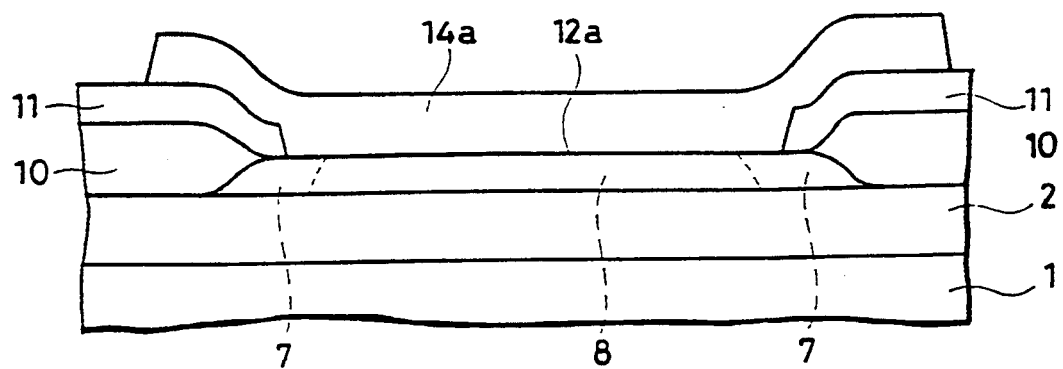

FIG. 6A to 6C are sectional views showing a partly modified example of the manufacturing method shown in FIG. 5A to FIG. 5F.

Referring to FIG. 6A, a part of the step shown in FIG. 5D is changed. More specifically, in FIG. 6A, a second resist pattern 21 is additionally formed so as to cover the body region extending a little further than a tip of the bird's beak of the isolation oxide film by thermal diffusion. Then, by selectively implanting the n type impurity ions 19 to a higher concentration using the first and the second resist patterns 20 and 21 as masks, the source region 8 and the drain region 9 are formed. According to the step of FIG. 6A, a width of the body region 7 can be left greater than that left by the step of FIG. 5D.

Referring to FIG. 6B, thereafter an interlayer insulating film 11, conductors 14a and 14c and the like are formed, accomplishing an SOI-MOSFET.

FIG. 6C is a sectional view taken along a line E—E in FIG. 6B. As is clear from the drawing, since the body region 7 extends further than the tip of the bird's beak of the isolation oxide film, the contact hole 12a need to remove the bird's beak.

Figure 7:
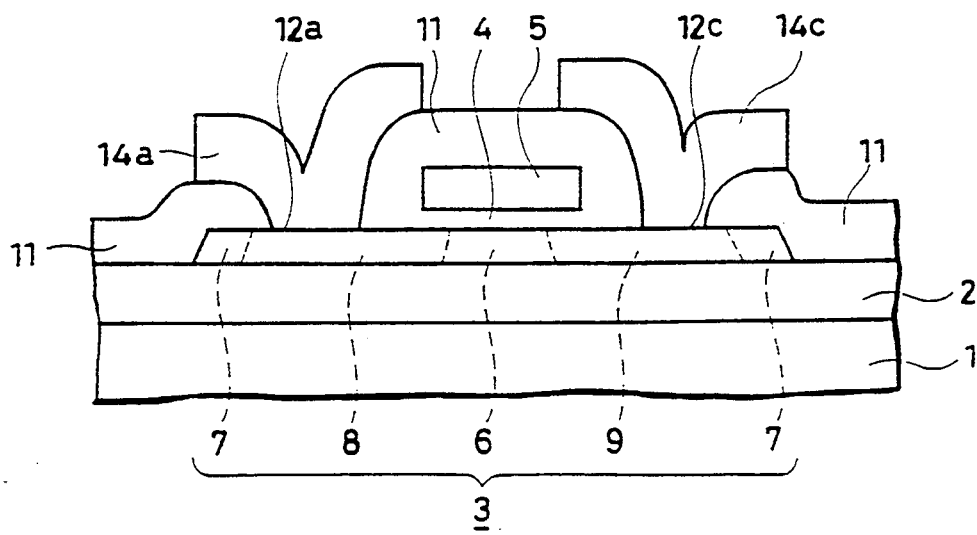
FIG. 7 is a sectional view showing an SOI-MOSFET according to another embodiment of the present invention.

FIG. 7 is a sectional view showing an SOI-MOSFET according to embodiment of the present invention. Although the SOI-MOSFET of FIG. 7 is similar to that of FIG. 2, no isolation oxide film 10 is provided. More specifically, the silicon layer 3 itself is patterned as an island, and the interlayer insulating film 11 also serves as an isolation oxide film.

FIG. 8A to FIG. 8D are sectional views for explaining a method of manufacturing such an SOI-MOSFET as shown in FIG. 7.

Figure 8A:
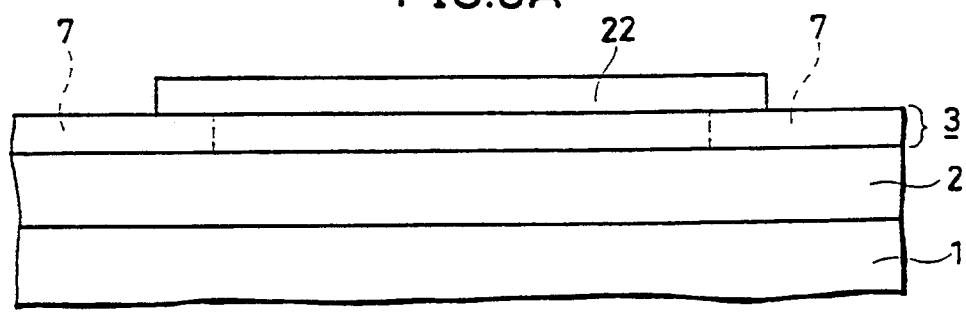
FIG. 8A to FIG. 8D are sectional views for explaining a method of manufacturing such an SOI-MOSFET as shown in FIG. 7.

Referring to FIG. 8A, what is formed on the silicon layer 3 is a patterned silicon oxide film 22. By implanting ions of the p type impurity to a higher concentration, using the resist layer (not shown) used for patterning the oxide film 22 itself as a mask, the body region 7 is formed. Then, after the removal of the resist layer, the body region 7 is extended under a peripheral portion of the oxide film 22 by thermal diffusion process in inert gas.

Figure 8B:
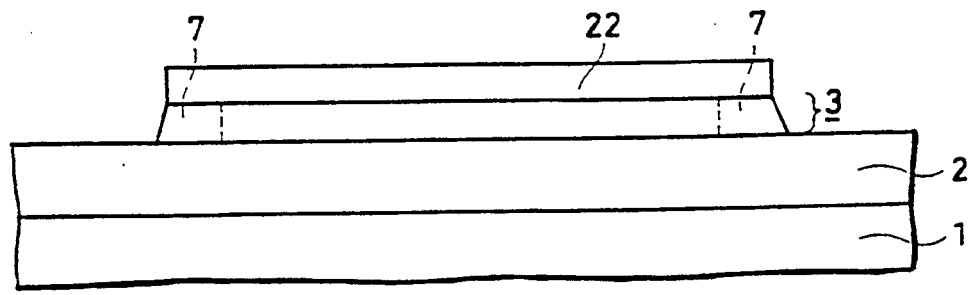

Referring to FIG. 8B, the silicon layer 3 is etched into an island, using the silicon oxide film 22 as a mask.

Figure 8C:
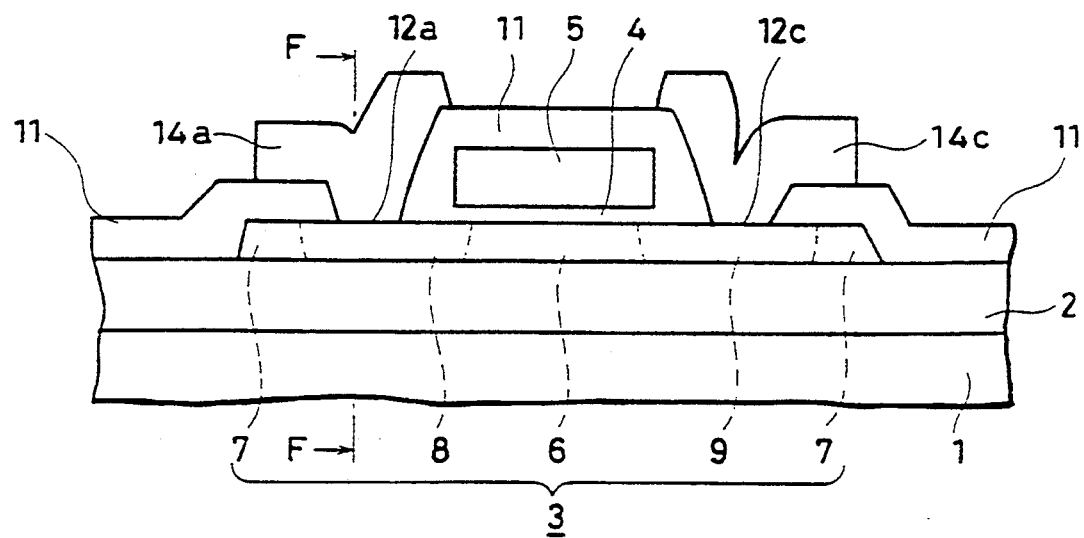

Thereafter, through a step similar to that shown in FIG. 6A, an SOI-MOSFET of FIG. 8C is accomplished.

Figure 8D:
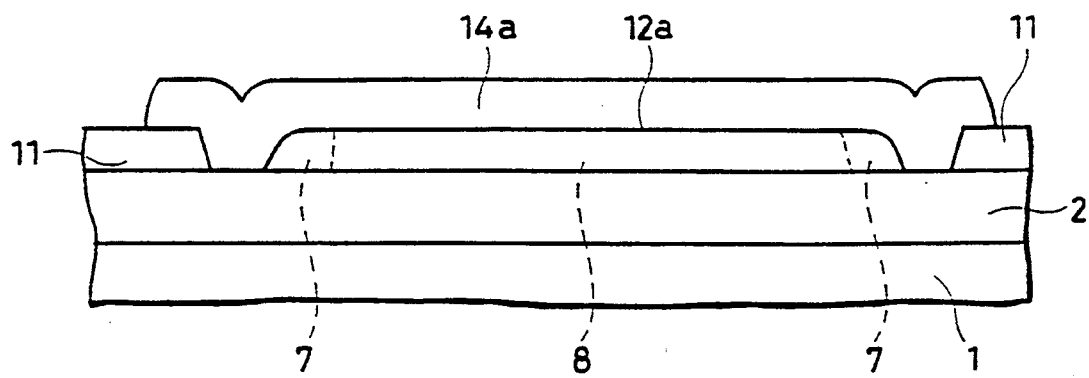

FIG. 8D is a sectional view taken along a line F—F in FIG. 8C. Also in this case, the conductor 14a is connected to the source region 8 and the body region 7 in common through the contact hole 12a formed in the interlayer insulating film 11.

Figure 9:
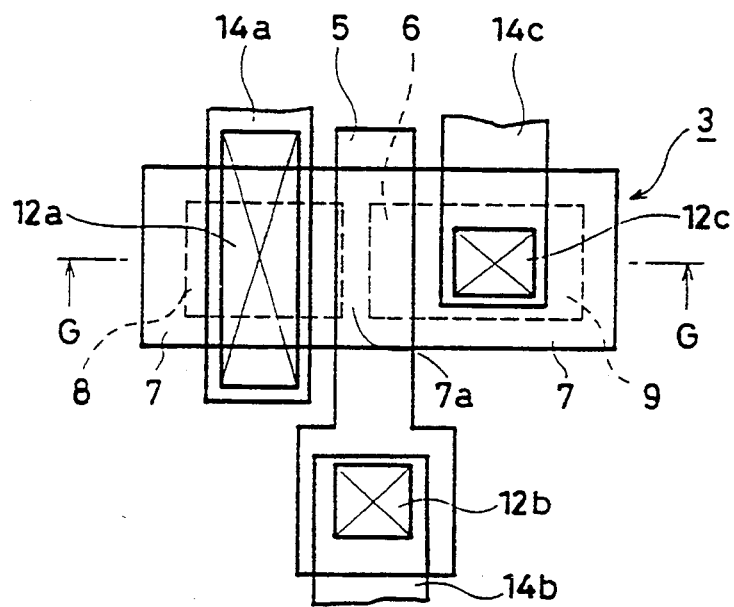
FIG. 9 is a plan view showing an SOI-MOSFET according to a further embodiment of the present invention.
Figure 10:
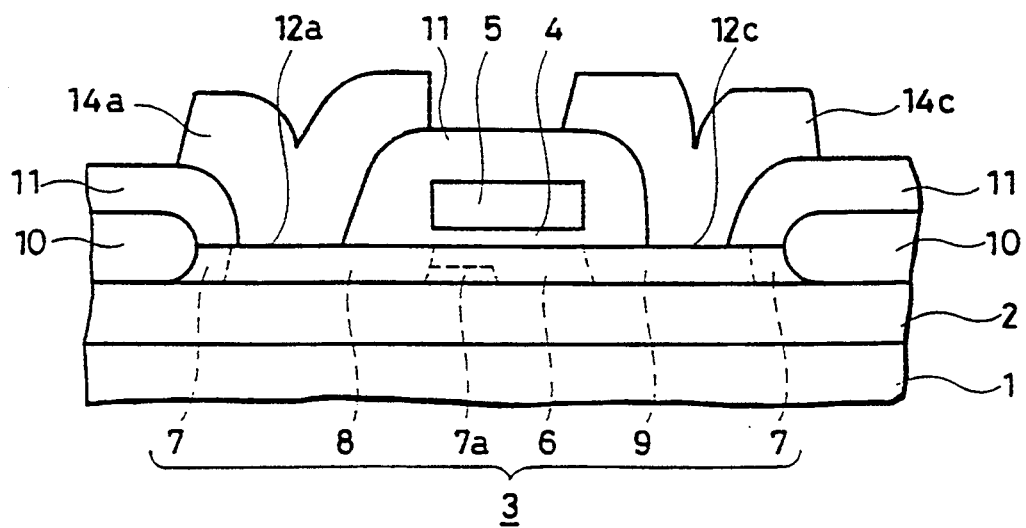
FIG. 10 is a sectional view taken along a line G—G in FIG. 9.

FIG. 9 is a plan view showing an SOI-MOSFET according to a further embodiment of the present invention, and FIG. 10 is a sectional view taken along a line G—G in FIG. 9. Although the SOI-MOSFET shown in FIG. 9 and FIG. 10 is similar to that shown in FIG. 1 and FIG. 2, a second body region 7a connected to the first body region 7 is additionally provided in the SOI-MOSFET shown in FIGS. 9 and 10. The second body region 7a is formed adjacent and along a boundary of the source region 8 and in a lower partial layer of the channel region 6. Then, opposite ends of the second body region 7a in a longitudinal direction are united with the first body region 7.

The second body region 7a can rapidly absorb and send the excessive holes generated in the channel layer 6 by impact ionization to the first body region. More specifically, in the SOI-MOSFET shown in FIGS. 9 and 10, the excessive holes in the channel layer 6 can be more rapidly removed.

The second body region 7a is provided only near a source interface because of the following reasons. That is, if the p+ type second body region is formed also adjacent to a boundary of the n+ type drain region 9, a junction withstand voltage of the drain region is decreased, followed by an decrease of a withstand voltage between source and drain. In addition, if the second body region is formed in a whole area of the lower partial layer of the channel region 6, the whole channel region can not be depleted by a gate voltage, so that characteristics of a transistor cannot be improved.

Figure 11A:
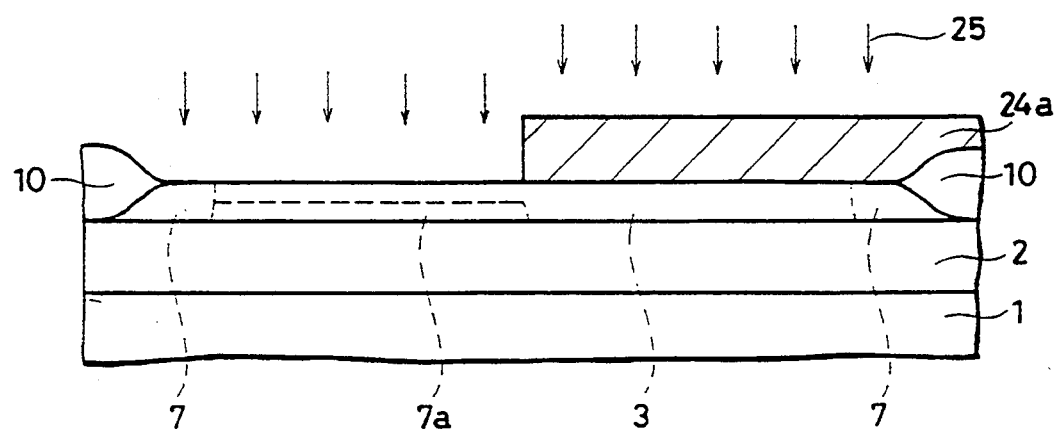
FIG. 11A and FIG. 11B are sectional views for explaining a method of manufacturing such an SOI-MOSFET as shown in FIG. 10.
Figure 11B:
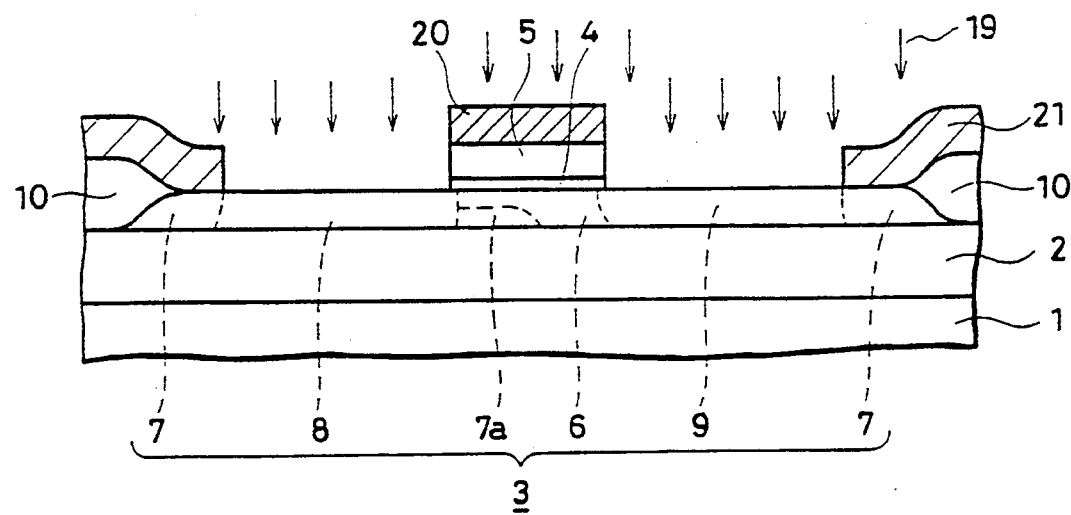

FIGS. 11A and 11B are sectional views for explaining a method of manufacturing such an SOI-MOSFET as shown in FIG. 10.

Referring to FIG. 11A, the silicon nitride film 16 is removed after the steps shown in. FIG. 5A to FIG. 5C. Then, in the semiconductor layer 3, an area which will be the drain region and a part of an area which will be the channel region are covered with a resist pattern 24a. Ions of p type impurity 25 are implanted to a higher concentration (for example, $10^{17}$–$10^{19}$ atoms/cm$^3$) in an lower partial layer portion 7a of the semiconductor layer 3, using the resist pattern 24a as a mask.

Referring to FIG. 11B, ions of n type impurity 19 are implanted in the semiconductor layer 3, using the resist layers 20 and 21 as masks as in FIG. 6A, so that the source region 8 and the drain region 9 are formed. Then, after the removal of the resist layers 20 and 21, an interlayer insulating film 11 and conductors 12a and 12c and the like are formed, thereby accomplishing the SOI-MOSFET of FIG. 10.

Figure 12A:
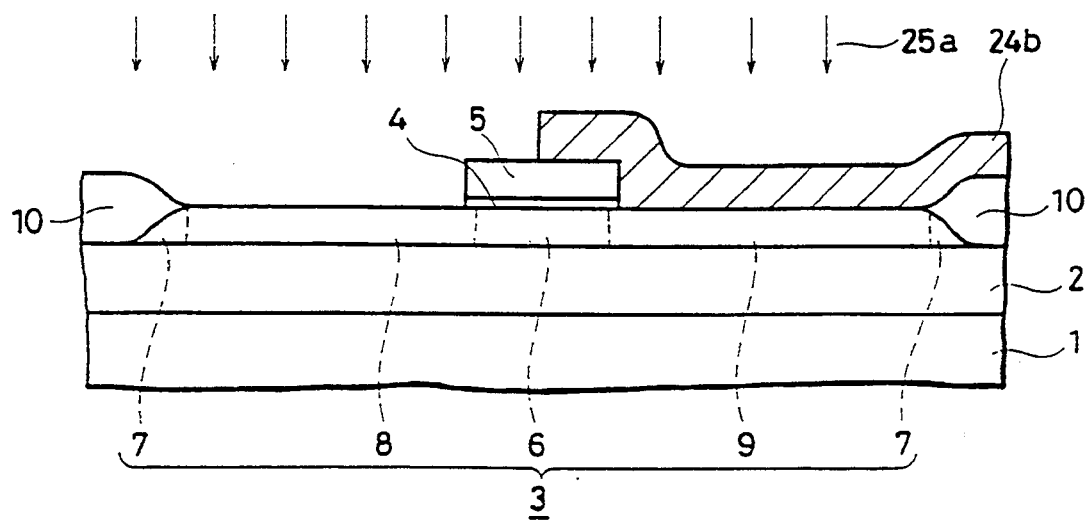
FIG. 12A and FIG. 12B are sectional views for explaining modifications of a method of manufacturing such a SOI-MOSFET as shown in FIG. 10.
Figure 12B:
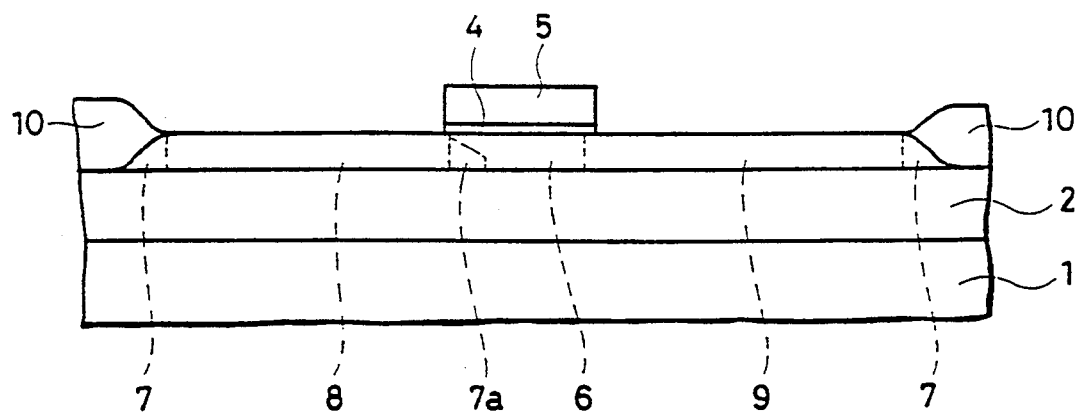

FIG. 12A and 12B are sectional views for explaining a modified example of a method of manufacturing such an SOI-MOSFET as shown in FIG. 10.

Referring to FIG. 12A, after the step of FIG. 5D, the source region 9 is covered with a resist pattern 24b. Then, boron ions 25a are implanted in the lower partial layer of the source region 8 using the resist pattern 24b as a mask.

As shown in FIG. 12B, since the boron has a very large diffusion coefficient in the silicon as compared with an n type impurity, a second body region 7a extending from the lower partial layer of the source region 8 into the channel region 6 can be formed by heat treatment.

Thereafter, an interlayer insulating film 11 and conductors 12a and 12c and the like are formed, thereby accomplishing such a SOI-MOSFET as shown in FIG. 10.

FIG. 13A to FIG. 13D are sectional views for explaining a structure and a manufacturing method of another SOI-MOSFET comprising a second body region.

Figure 13A:
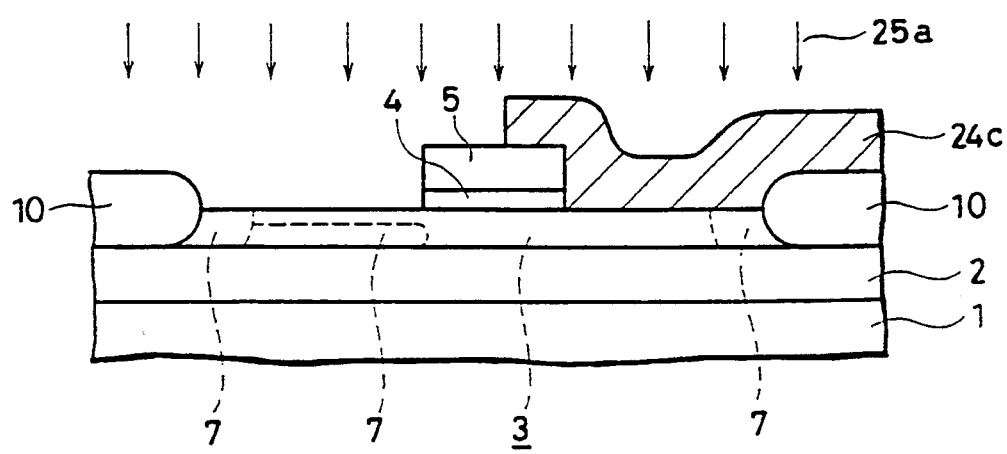
FIG. 13A to FIG. 13D are the sectional views for explaining a structure and a manufacturing method of another SOI-MOSFET of the present invention.

Referring to FIG. 13A, after the step of FIG. 5C, a gate dielectric thin film 4 and a gate electrode 5 are formed and an area which will be a drain region in the silicon layer 3 is covered with a resist pattern 24c. Ions of boron 25a are implanted in a lower partial layer 7a of an area which will be a source region in the silicon layer 3, using the resist pattern 24c as a mask.

Figure 13B:
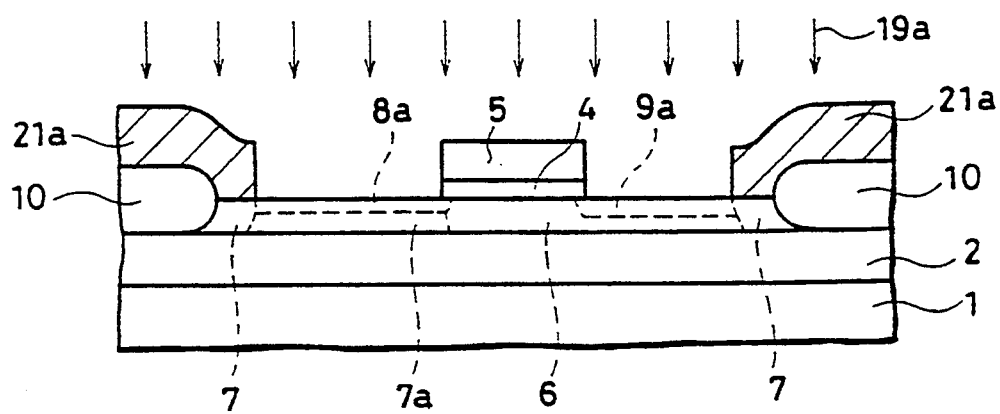

Referring to FIG. 13B, after the removal of the resist pattern 24c, by covering the first body region 7 with a resist pattern 21a and implanting ions of phosphorus 19a, an additional source region 8a and an additional drain region 9a of a low impurity concentration (for example, $10^{17}$–$10^{18}$ atoms/cm$^3$) are formed.

Figure 13C:
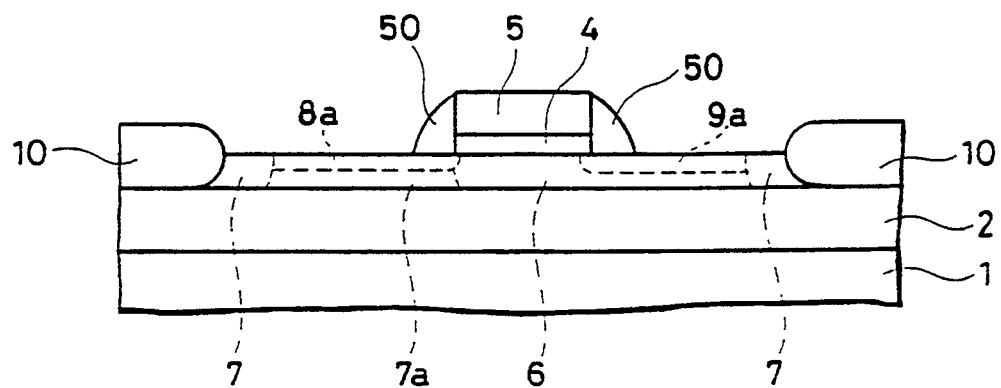

Referring to FIG. 13C, a oxide film (not shown) is deposited so as to cover the silicon layer 3 and the gate electrode by CVD method after the removal of the resist pattern 21a. An insulator wall 50 is left on side walls of the gate electrode 5 by reactive ion etching of the deposited oxide film.

Figure 13D:
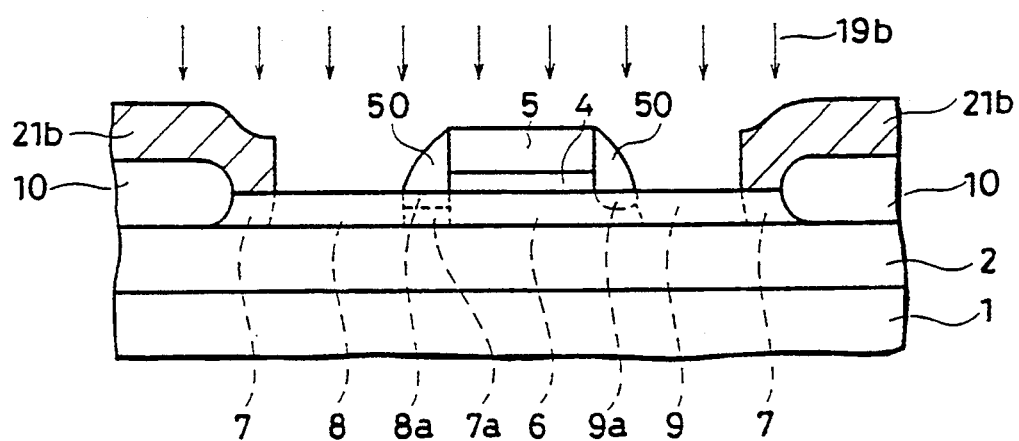

Referring to FIG. 13D, the first region 7 is again covered with a resist pattern 21b. A source region 8 and a drain region 9 are formed by implanting arsenic ions 19b using the resist pattern 21b, the insulating wall 50 and the gate electrode 5 as masks. SOI-MOSFET thus formed comprises not only the second body region 7a but also an additional LDD (lightly doped drain) 9a. The LDD 9a attenuates an electric field near the drain, thereby contributing to reduction of the impact ionization itself which generates excessive holes in the channel region 6.

Figure 14:
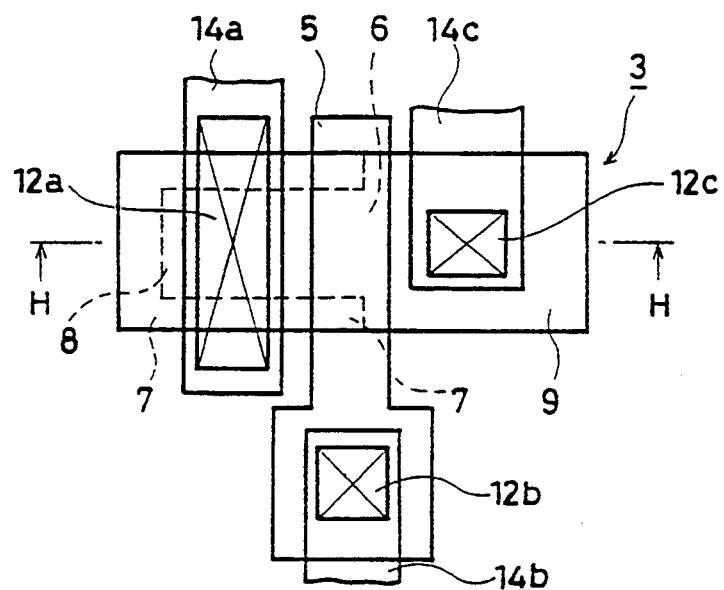
FIG. 14 is a plan view showing an SOI-MOSFET according to still another embodiment of the present invention.

FIG. 14 is a plan view showing an SOI-MOSFET according to a still another embodiment of the present invention, and FIG. 15 is a sectional view taken along a line H—H in FIG. 14. In the SOI-MOSFET, the body region 7 is not provided in a whole periphery of the silicon layer 3, and does not contact with the drain region 9. More specifically, since the drain region 9 having high-concentration of n type impurity and the body region 7 having high-concentration of p type impurity are not in contact with each other, there will be no possibility that a withstand voltage between source and drain is deteriorated due to deterioration of a junction withstand voltage of the drain 9.

In the above described various embodiments, although description was given to the n channel type SOI-MOSFET, it will be apparent to those skilled in the art that the present invention can be applied to a p channel type SOI-MOSFET.

In addition, it will be apparent that the silicon layer 3 may be other semiconductor layers.

In addition, in the above described embodiments, although the ions are implanted using a resist patterns, and/or in a self-alignment manner, FIB (focused ion beam) method may be employed when a higher precision of ion implantation is desired.

Furthermore, it will be apparent that the body region 7 and the source region 8 do not always need to be electrically connected through a common and single contact hole, and they may be electrically connected through respective contact holes.

Furthermore, if an impurity concentration of the body region is not sufficient to form a metal conductor and an ohmic contact, the impurity concentration can be easily increased only in the region where the contact is formed, by the practitioners skilled in the art.

As described above, in the SOI-MOSFET according to the present invention, the body region having the high impurity concentration of the same conductivity type as that of the channel region is formed in contact with at least a part of the channel region and at least a part of the periphery of the source region, the body region can be formed barely increasing the planar area occupied by the SOI-MOSFET and without making manufacturing steps complicated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a MOS field effect transistor comprising the steps of:
    forming a silicon layer (3) of a first conductivity type on an insulator substrate (2),
    covering said silicon layer (3) with a nitride layer (16),
    covering a part of said nitride layer (16) with a first resist layer (17),
    etching said nitride layer (16) using said first resist layer (17) as a mask, thereby leaving said nitride layer (16) on a transistor region of said silicon layer (3),
    forming a body region (7) in an outer periphery of the transistor region of said silicon layer (3) by implanting ions of an impurity (18) of the first conductivity type using said resist layer (17) as a mask,
    forming an isolation oxide film (10) and diffusing the impurity in said body region (7) toward the center of said transistor region by thermally oxidizing said silicon layer (3) using said nitride layer (16) as a mask after the removal of said first resist layer (17), thereby leaving the body region (7) at least under a bird's beak of said isolation oxide film (10) in a peripheral portion of said transistor region of said silicon layer (3),
    forming a gate insulating film (4) and a gate electrode (5) using a second resist layer (20) after the removal of said nitride film (16),
    forming a source region (8) and a drain region (9) by implanting ions of an impurity (19) of a second conductivity type using said second resist layer (20) and said isolation oxide film (10) as masks,
    covering said silicon layer (3) and said gate electrode (5) with an interlayer insulating film (11) after the removal of said second resist layer (20),
    forming a contact hole (12a) exposing not only a part of said source region (8) but also a part of said body region (7),
    forming a conductor (14a) to be connected to said source region (8) and said body region (7) through said contact hole (12a).

2. A method of manufacturing a MOS field effect transistor according to claim 1, wherein during said ion implantation of impurity (19) of the second conductivity type, said body region (7) is covered with a third resist layer (21).

3. A method of manufacturing a MOS field effect transistor comprising the steps of:
    forming a semiconductor layer (3) of a first conductivity type on an insulator substrate (2),
    covering said semiconductor layer (3) with an oxide layer (22),
    covering a part of said oxide layer (22) with a first resist layer,
    etching said oxide layer (22) using said first resist layer as a mask, thereby leaving said oxide layer (22) on a transistor region of said semiconductor layer (3),
    forming a body region (7) in an outer periphery of the transistor region of said semiconductor layer (3) by implanting ions of an impurity of the first conductivity type using said first resist layer as a mask,
    diffusing the impurity in said body region (7) toward the center of said transistor region by a heat treatment in an inert atmosphere after the removal of said first resist layer, so that said body region (7) extends under a peripheral portion of said oxide layer (22),
    leaving the transistor region of said semiconductor layer (3) as an island by etching using said oxide layer (22) as a mask,
    forming a gate insulating film (4) and a gate electrode (5) using a second resist layer after the removal of said oxide layer (22), forming a source region (8) and a drain region (9) by implanting ions of an impurity of a second conductivity type using in addition to said second resist layer, a third resist layer covering said body region (7) as a mask, covering said semiconductor layer (3) and said gate electrode (5) with an interlayer insulating film (11) after the removal of said second and third resist layers, forming a contact hole (12a) exposing not only a part of said source region (8) but also a part of said body region (7), forming a conductor (14a) to be connected to said source region (8) and said body region (7) through said contact hole (12a).

4. A method of manufacturing a MOS field effect transistor comprising the steps of:

forming a silicon layer (3) of a first conductivity type on an insulator substrate (2), covering said silicon layer (3) with a nitride layer (16), covering a part of said nitride layer (16) with a first resist layer (17), etching said nitride layer (16) using first said resist layer (17) as a mask, thereby leaving said nitride layer (16) on a transistor region of said silicon layer (3), forming a body region (7) in an outer periphery of the transistor region of said silicon layer (3) by implanting ions of an impurity (18) of the first conductivity type using said first resist layer (17) as a mask, forming an isolation oxide film (10) and diffusing the impurity in said body region (7) toward the center of said transistor region by thermally oxidizing said silicon layer (3) using said nitride layer (16) as a mask after the removal of said first resist layer (17), thereby leaving the body region (7) at least under a bird's beak of said isolation oxide film (10) in a peripheral portion of said transistor region of said silicon layer (3), implanting ions of an impurity (25) of the first conductivity type in a lower partial layer (7a) of a first region, using a second resist layer (24a) covering a second region in said transistor region as a mask, forming a gate insulating film (4) and a gate electrode (5) along a boundary between said first and second regions, using a third resist layer (20) after the removal of said second resist layer (24a), forming a source region (8) and a drain region (9), and leaving an additional body region (7a) extending in contact with said source region (8) in a lower partial layer in a channel region (6) provided between said source region (8) and said drain region (9), by implanting ions of an impurity (19) of a second conductivity type, using said third resist layer (20) and said isolation oxide film (10) as masks, covering said silicon layer (3) and said gate electrode (5) with an interlayer insulating film (11) after the removal of said third resist layer, forming a contact hole (12a) exposing not only a part of said source region (8) but also a part of said body region (7), forming a conductor (14a) to be connected to said source region (8) and body region (7) through said contact hole (12a).

5. A method of manufacturing a MOS field effect transistor according to claim 4, wherein during said ion implantation of impurity (19) of the second conductivity type, said body region (7) is covered with a fourth resist layer (21).

6. A method of manufacturing a MOS field effect transistor comprising the steps of:

forming a p conductivity type silicon layer (3) on an insulator substrate (2), covering said silicon layer (3) with a nitride layer (10), covering a part of said nitride layer (16) with a first resist layer (17), etching said nitride layer (16) using said first resist layer (17) as a mask, thereby leaving said nitride layer (16) on a transistor region of said silicon layer (3), forming a body region (7) in an outer periphery of the transistor region of said silicon layer (3) by implanting ions of a p type impurity (18) using said first resist layer (17) as a mask, forming an isolation oxide film (10) and diffusing the impurity in said body region (7) toward the center of said transistor region by thermally oxidizing said silicon layer (3), using said nitride layer (16) as a mask, after the removal of said first resist layer (17), thereby leaving the body region (7) at least under a bird's beak of said isolation oxide film (10) in a peripheral portion of said transistor region of said silicon layer (3), forming a gate insulating film (4) and a gate electrode (5) using a second resist layer (20) after the removal of said nitride layer (16), forming a source region (8) and a drain region (9) by implanting ions of an n conductivity type impurity (19), using said second resist layer (20) and said isolation oxide film (10) as masks, implanting ions of a p conductivity type impurity in a lower partial layer of said source region (8), using a third resist layer (24b) covering said drain region (9), diffusing the p conductivity type impurity of the lower partial layer of said source region (8) into said channel region (6) by heat treatment in an inert atmosphere after the removal of said second and third resist layers (21, 24b), thereby forming an additional body region (7a) extending in contact with said source region (8) in a lower partial layer of said channel region (6), covering said silicon layer (3) and said gate electrode (5) with an interlayer insulating film (11), forming a contact hole (12a) exposing not only a part of said source region (8) but also a part of said body region (7), forming a conductor (14a) to be connected to said source region (8) and body region (7) through said contact hole (12a).

7. A method of manufacturing a MOS field effect transistor according to claim 6, wherein during said ion implantation of n conductivity type impurity (19), said body region (7) is covered with a fourth resist layer (21).

8. A method of manufacturing a MOS field effect transistor comprising the steps of:

forming a silicon layer (3) of a first conductivity type on an insulator substrate (2), covering said silicon layer (3) with a nitride layer (16), covering a part of said nitride layer (16) with a first resist layer (17), etching said nitride layer (16) using said first resist layer (17) as a mask, thereby leaving said nitride layer (16) on a transistor region of said silicon layer (3), forming a body region (7) in an outer periphery of the transistor region of said silicon layer (3) by implanting ions of an impurity (18) of the first conductivity type using said first resist layer (17) as a mask, forming an isolation oxide film (10) by thermally oxidizing said silicon layer (3) using said nitride layer (16) as a mask after the removal of said first resist layer (17) and diffusing the impurity in said body region (7) toward the center inside of said transistor region, thereby leaving the body region (7) at least under a bird's beak of said isolation oxide film (10) in a peripheral portion of said transistor region of said silicon layer (3), forming a gate insulating film (4) and a gate electrode (5) using a second resist layer (20) after the removal of said nitride layer (16), implanting ions of an impurity (25a) of a second conductivity type in a lower partial layer (7a) of said source region (8), using a third resist layer (24c) covering said drain region (9), forming a source layer (8a) and a drain layer (9a) of low impurity concentration by implanting ions of an impurity (19a) of the second conductivity type into an upper portion of said silicon layer (3) after the removal of said second and third resist layers (20, 24c), forming an oxide layer (50) on a side wall of said gate electrode (5) by anisotropic etching, forming a source region (8) and a drain region (9) by implanting ions of an impurity (19b) of the second conductivity type of high impurity concentration into said silicon layer (3), thereby leaving an additional body region (7a) in a lower partial layer portion between the source region (8), and the channel region (6), and leaving a lightly doped drain region (9a) in contact with the drain region (8), covering said semiconductor layer (3) and said gate electrode (5) with an interlayer insulating film (11), forming a contact hole (12a) exposing not only a part of said source region (8) but also a part of said body region (7), forming a conductor (14a) to be connected with said source region (8) and body region (7) through said contact hole (12a).

9. A method of manufacturing a MOS field effect transistor according to claim 8, wherein during both first and second of the ion implantations of said impurities (19a, 19b) of the second conductivity type, said body region (7) is covered with fourth and fifth resist layers (21a, 21b), respectively.

* * * * *